United States Patent
Querbach et al.

(10) Patent No.: US 7,139,957 B2
(45) Date of Patent: *Nov. 21, 2006

(54) AUTOMATIC SELF TEST OF AN INTEGRATED CIRCUIT COMPONENT VIA AC I/O LOOPBACK

(75) Inventors: Bruce Querbach, Orangevale, CA (US); David G. Ellis, Tualatin, OR (US); Amjad Khan, Folsom, CA (US); Michael J. Tripp, Forest Grove, OR (US); Eric S. Gayles, Folsom, CA (US); Eshwar Gollapudi, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 550 days.

This patent is subject to a terminal disclaimer.

(21) Appl. No.: 10/611,099

(22) Filed: Jun. 30, 2003

(65) Prior Publication Data

US 2004/0267479 A1    Dec. 30, 2004

(51) Int. Cl.
  *G01R 31/28* (2006.01)
  *G11C 29/00* (2006.01)
(52) U.S. Cl. ............. 714/745; 714/721; 714/724
(58) Field of Classification Search ............. 714/724, 714/735, 721, 745, 738
See application file for complete search history.

(56) References Cited

U.S. PATENT DOCUMENTS

| 5,444,715 | A * | 8/1995 | Gruetzner et al. ........... 714/727 |
| 5,586,123 | A | 12/1996 | Baker |
| 5,621,739 | A | 4/1997 | Sine et al. |
| 5,701,306 | A | 12/1997 | Arai |
| 6,199,182 | B1 * | 3/2001 | Whetsel ....................... 714/724 |
| 6,286,119 | B1 * | 9/2001 | Wu et al. ...................... 714/726 |
| 6,381,722 | B1 * | 4/2002 | Salmon et al. .............. 714/745 |
| 6,477,674 | B1 | 11/2002 | Bates et al. |
| 6,615,379 | B1 | 9/2003 | Tripp et al. |
| 6,877,121 | B1 * | 4/2005 | Srinivasaiah et al. ........ 714/727 |
| 6,889,350 | B1 * | 5/2005 | Fought et al. .............. 714/745 |
| 6,928,593 | B1 * | 8/2005 | Halbert et al. .............. 714/718 |
| 6,986,087 | B1 * | 1/2006 | Laake et al. ................. 714/724 |
| 2002/0053056 | A1 | 5/2002 | Kuegler et al. |
| 2002/0079926 | A1 | 6/2002 | Haycock et al. |
| 2002/0105353 | A1 | 8/2002 | Mori et al. |
| 2003/0005374 | A1 | 1/2003 | Fought et al. |

OTHER PUBLICATIONS

U.S. Appl. No. 10/224,494—Tripp, et al., filed Aug. 12, 2002 entitled "Device Testing" (pending).

U.S. Appl. No. 10/319,517—Nejedlo, et al., filed Dec. 16, 2002 entitled "Testing Methodology and Apparatus for Interconnects" (pending).

(Continued)

*Primary Examiner*—Cynthia Britt
(74) *Attorney, Agent, or Firm*—Blakely, Sokoloff, Taylor & Zafman LLP

(57) ABSTRACT

A multi-bit test value is loaded into a built-in latch of the IC component, and a pad of the component is selected for testing. A number of different sequences of test values are automatically generated, based on the stored test value, without scanning-in additional multi-bit values into the latch. A signal that is based on the different sequences of test values is driven into the selected pad and looped back. A difference between the test values and the looped back version of the test values is determined, while automatically adjusting driver and/or receiver characteristics to determine a margin of operation of on-chip I/O buffering for the selected pad.

40 Claims, 6 Drawing Sheets

OTHER PUBLICATIONS

U.S. Appl. No. 10/404,405—Ellis, et al., filed Mar. 31, 2003 entitled "Push Button Mode Automatic Pattern Switching for Interconnect Built-In Self Test" (pending).

U.S. Appl. No. 10/404,622—Canagasaby, et al., filed Mar. 31, 2003 entitled "On-Die Pattern Generator for High Speed Serial Interconnect Built-In Self Test" (pending).

* cited by examiner

AUTOMATIC SELF TEST OF AN INTEGRATED CIRCUIT COMPONENT VIA AC I/O LOOPBACK

FIELD OF THE INVENTION

The embodiments of the invention are in general related to the testing of integrated circuit components, and more particularly to built-in self test capabilities.

BACKGROUND

Before an integrated circuit (IC) component, such as a processor or a main memory device, may be used in a system, proper functionality and timing within each input/ output (I/O) buffer of the component needs to be verified. This may be accomplished by placing the component on a so called semiconductor tester which has a channel for each I/O pin of the component. Test patterns are then communicated back and forth between the component and the tester on each pin, and the proper functionality and timing of an I/O buffer is verified by comparing an actual received or driven test value with an expected received or driven test value.

In modern, high performance electronic systems, however, there is also a need to test the system or platform of which the IC component is a part. Traditionally, probing techniques have been used for such a purpose, where a probe is used to pick up signals that are being driven between IC components of the system. However, that technique is proving to be less reliable as signal switching speeds increase. To reduce the need for such probing, built-in self test circuitry can be added inside each IC component, to verify, at speed, inter-component communications in the system.

In U.S. Pat. No. 6,477,674 assigned to the same assignee as that of this application, namely Intel Corp., an I/O loopback test is described for self testing the I/O buffers of an IC component using switching signals (hence the use of "AC"). Such a test may be carried out by driving test data out of the IC component through an output portion of an I/O buffer. Subsequently, the data is driven back through an input portion of the I/O buffer. A comparison is then made to verify that the correct data has been received. This helps verify whether the input and output portions of each I/O buffer associated with a pin of the component are functioning properly, without the need for external probing or connecting with a tester. The I/O circuitry thus tests itself, independent of the component's core logic. In that instance, an I/O buffer is described as having an I/O pad, an output driver, an input receiver, and a test circuit that generates test pattern signals when the I/O buffer is operating in a test mode. A latch is used to store an error signal that is generated as part of the test. The latch may be a boundary scan latch whose contents may be examined by other IC components of the system or by an external tester, as part of a boundary scan-chain (where test values from multiple IC components are shifted out serially). Using such a technique, test pattern values may be loaded into the latch one bit at a time, through a serial scan in port, and read out of the latch serially through a scan out port.

DETAILED DESCRIPTION

According to an embodiment of the invention, switching state (also referred to as AC) I/O loopback testing capabilities can automatically generate multiple, different test value sequences and stress the driver and/or receiver circuitry, without requiring that additional test patterns be loaded into the IC component through the scan-chain. This is expected to yield significantly faster, AC I/O loopback testing in IC components that feature a large number of I/O pins (such as advanced processors, system interface components (referred to as chipsets), and main memory devices).

Figure 1:
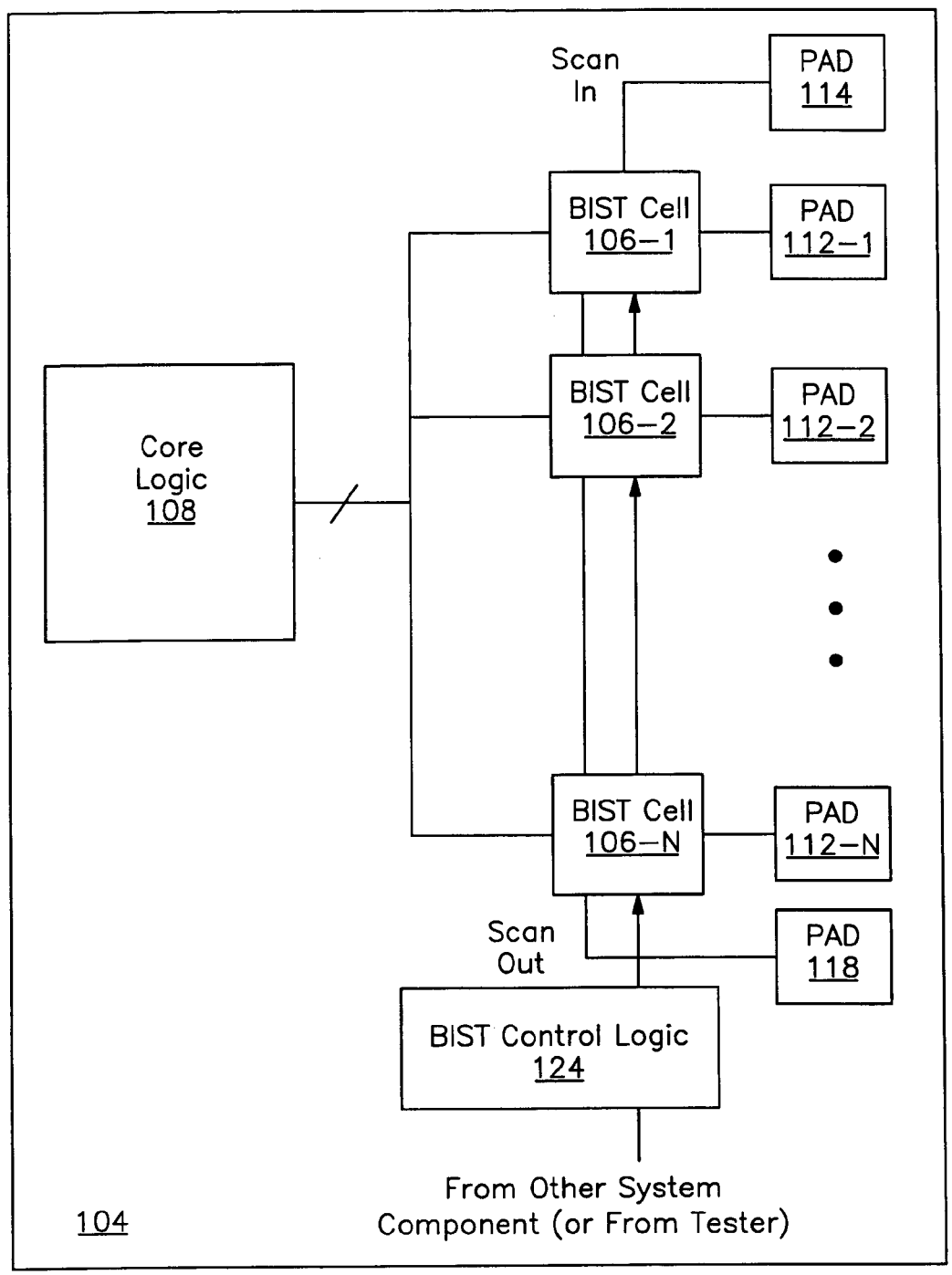
FIG. 1 illustrates a conceptual block diagram of an IC component with built-in self test BIST capabilities including multiple BIST cells.

Beginning with FIG. 1, what is shown is a conceptual block diagram of an IC component 104 that has been enhanced with a number of BIST cells 106_1, 106_2, ... 106_N. Each of the cells 106 is coupled between core logic 108 and a respective one of component signal pads 112_1, 112_2, ... 112_N. Each BIST cell 106 has a latch (not shown in FIG. 1) that is capable of storing a multi-bit value. The latch has scan-chain input and output capability, where "scan in" refers to receiving information from outside of the component 104 via scan input pad 114, while "scan out" refers to the sequential shifting of bits out of the component 104 via the scan out pad 118.

The BIST cells 106 are programmable in that they can be configured to perform AC I/O loopback testing, as well as operating normally to forward core data to and from the core logic 108. The configuration may be orchestrated from other system components or from a tester (not shown) which communicates via BIST control logic 124. The interface to the other system components or the external tester may be, for instance, a low speed test bus (not shown). This would be separate from the high speed, high performance parallel or serial bus to which the signal pads 112 will be connected when the component 104 is installed on a carrier substrate.

In some embodiments, all of the components shown in FIG. 1, including core logic 108, BIST cells 106, pads 112, 114, and 118, as well as BIST control logic 124 are formed on the same IC die that is a part of the IC component 104. In other embodiments, some of these components may be on different IC dies but as part of the same, multi-chip IC component. The AC I/O loopback testing capability of each cell 106 is shown in greater detail in FIG. 2.

Figure 2:
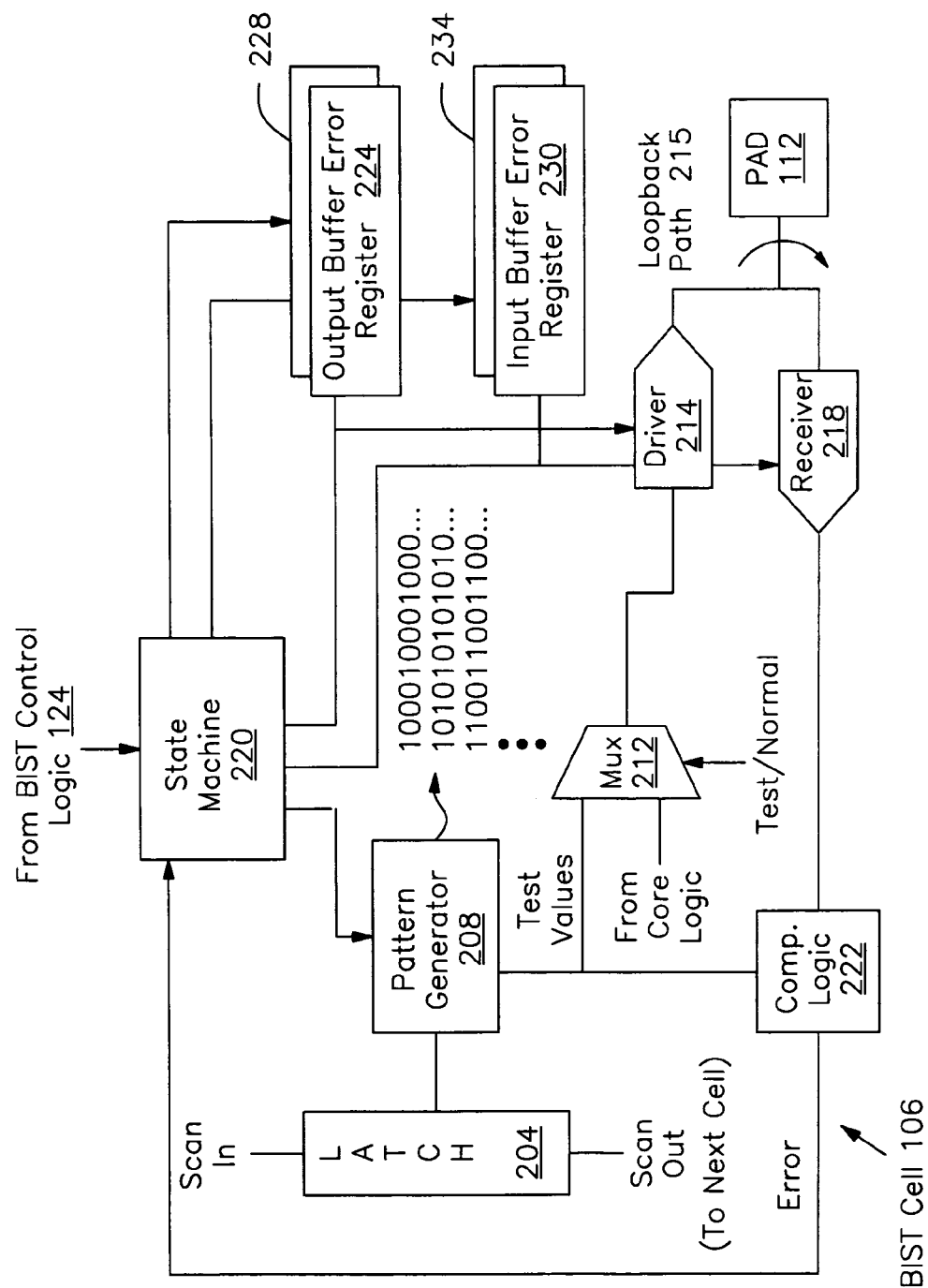
FIG. 2 shows a conceptual block diagram of a BIST cell with automatic AC I/O loopback testing capability.

Each BIST cell 106 as shown in FIG. 2 has a multi-bit latch 204 with scan-chain input and output capability. In some embodiments, an 8-bit value may be scanned into the latch, one bit at a time, and read out of the latch one bit at a time. Note that because of the scan-chain topology, it may take a significant amount of time to scan out a multi-bit value that is stored in the latch 204 of each BIST cell 106, particularly when the number of cells 106 are in the hundreds. However, the automatic loopback testing capability described here is expected to help significantly reduce the amount of time needed to perform the loopback testing, by not having to repeatedly load the latch 204 with a test value.

A pattern generator 208 having an input coupled to receive an initial, multi-bit test value from the latch 204 is to generate a sequence of test values (e.g., bits) based on that initial value. Its output test values are fed to an input of a multiplexor 212. The multiplexor 212 serves to forward either a sequence of test values from the pattern generator 208, or a sequence of core data or "normal" values from the core logic 108 (see FIG. 1). The multiplexor 212 is thus placed in either an AC I/O loopback test mode or a normal mode, under the direction of BIST control logic 124 (see FIG. 1). The output of the multiplexor 212 feeds a driver 214 which is to drive an output signal into its respective pad 112 in response to information at the output of the multiplexor 212. The driver 214 translates the value at its input into a signal level or waveform at the pad 112. Although not shown, the driver 214 may be clocked by a transmit clock signal of the IC component 104 (see FIG. 1), so that the test values are translated at speed, i.e. at the nominal, I/O buffer transmit clock frequency of the IC component in its normal mode of operation (e.g. from hundreds of MHz to several GHz). The BIST cell 106 shown in FIG. 2 also has a receiver 218 that is coupled to receive an input signal from its respective pad 112. Note the loopback path 215 in this embodiment is an on-chip signal trace that permanently connects the output of the driver 214 to the input of the receiver 218 as well as to its respective pad 112, for bi-directional use of the associated pin (not shown). The receiver 218 translates the input signal into a sequence of symbol values (e.g. bits).

Both the driver 214 and the receiver 218 are coupled to be controlled by a State machine 220. The state machine 220 automatically selects the setting of the electrical characteristics of the driver 214 and/or the receiver 218 during the AC I/O loopback test, and repeatedly adjusts the setting, while test values are being driven by the driver 214 and received by the receiver 218, until an output of comparison logic 222 indicates an error. In other words, the driver and/or receiver are stressed by deviating or changing their electrical characteristics from a nominal setting. The electrical characteristics that can be varied may include advancing or delaying a transition of a transmit or receive clock signal, changing a pull-up or pull-down termination resistance of the signal pad, and changing a threshold level of a receiver. Another embodiment of the invention features drivers and receivers that are part of a source synchronous link (see FIG. 4). In that case, the adjustment to the driver characteristics is by "pushing" the strobe signal associated with the pin being tested.

Should the comparison logic 222 detect a difference between a test value obtained from the pattern generator 208 and a looped back version of the test value, an error is signaled to the state machine 220. The comparison logic may be designed to detect the difference between corresponding transmitted and received bits; as an alternative, it may be designed to compare groups of bits via a parity, a checksum or other error detection mechanism.

The BIST cell 106 may contain an output buffer error register 224 to store, under control of the state machine 220, a "first fail" value that indicates the setting for the driver 214, at which the earliest error occurs, as indicated by the comparison logic 222. The state machine 220 then continues to adjust the electrical characteristics of, i.e. stress, the driver 214 while the test values continue to be driven. As the state machine 220 continues to "worsen" these electrical characteristics, a point is reached where substantially every single one of the test values that are being driven in a sequence result in an error at the comparison logic 222. At this point, a second fail value that represents the current setting of the driver 214, also referred to as an "all fail" value, is stored in a second output buffer error register 228. Note that the output buffer error registers 224 and 228 may alternatively be used to store the driver settings at other failure conditions, if desired. Similarly, a pair of input buffer error registers 230 and 234 may be used to store the settings of the receiver 218 upon the occurrence of a failure condition (as the receiver characteristics are being swept). The differences between the first fail and all fail values are a measure of the operating margin of the particular I/O buffer being tested. Other ways of determining the operating margin, by sweeping the electrical characteristic of the driver and/or receiver, are also possible.

As mentioned above, the state machine 220 is used to control the pattern generator 208 so that multiple, different sequences of test values (such as those shown in FIG. 2) are generated, based on a single multi-bit test value that is stored in the latch 204. This allows each BIST cell 106 to operate in test mode by scanning in a single, multi-bit value into its latch 204, rather than having to repeatedly load latch 204 with different test values to generate the different test patterns for the loopback testing. Significant savings in total test time can be achieved in this manner, particularly when there are hundreds of BIST cells 106 each of which has a separate multi-bit latch 204. For example, each latch 204 need only be loaded once for an AC I/O loopback test of the I/O buffers of the IC component.

Figure 3:
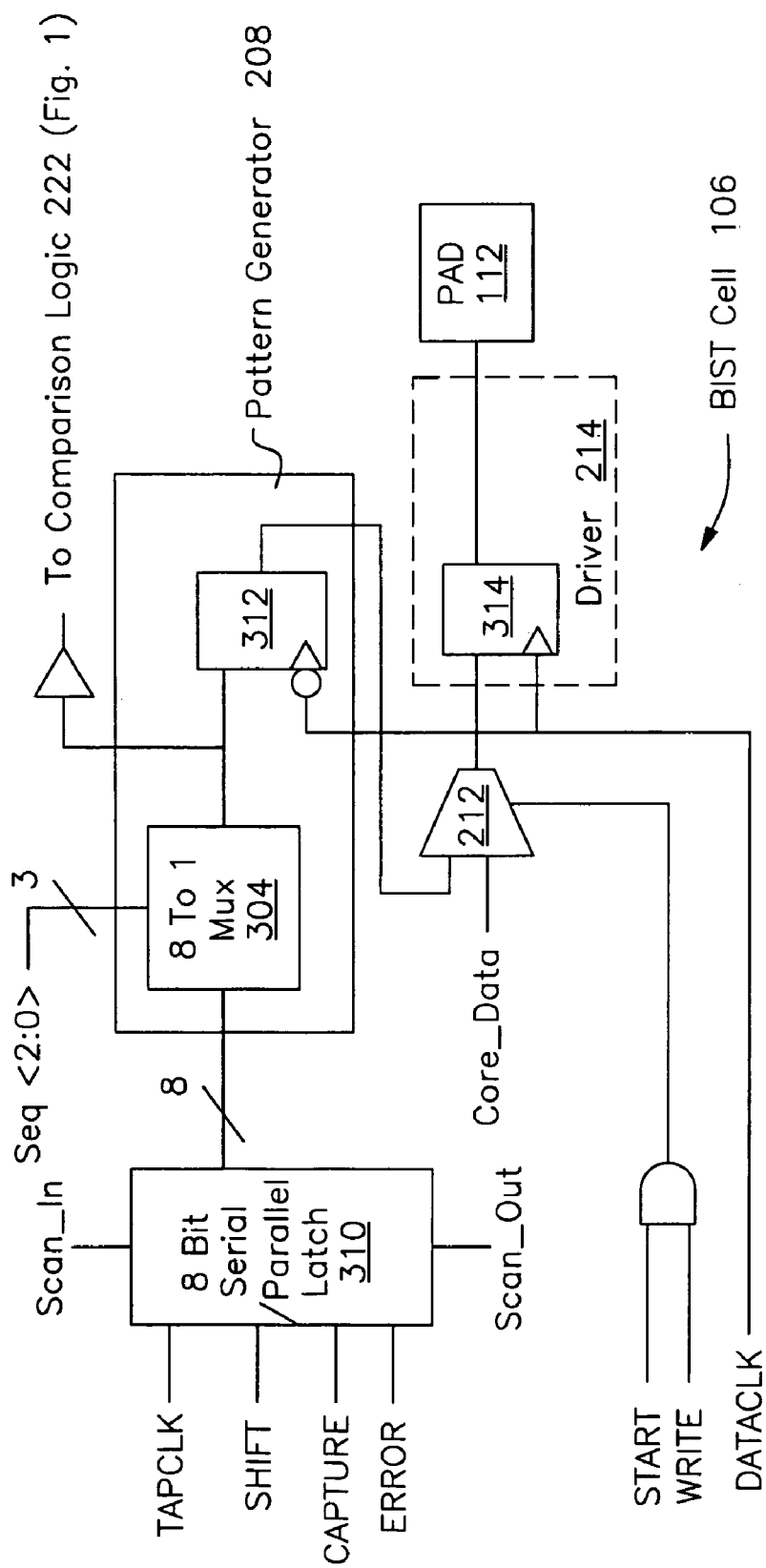
FIG. 3 depicts another embodiment of the BIST cell with automatic AC I/O loopback capability.

Turning now to FIG. 3, what is shown is example logic circuitry for implementing the pattern generator 208 as part of the BIST cell 106. In this embodiment, an 8:1 multiplexor 304 is provided whose input is coupled to receive an 8-bit value from an 8-bit, serial/parallel latch 310. One of 8 input bits is selected according to a 3 bit SEQ control input (from the state machine 220, see FIG. 2). The output of the multiplexor 304 provides a forwarded sequence of bits, as determined by the switching SEQ control input. Each sequence may be different, and is determined by the initial multi-bit test value (stored in the latch 310) and by the changing combination of SEQ. The sequence is further qualified a by latch circuit 312 which is clocked by a signal DATACLK. The output of the latch 312 feeds an input of the multiplexor 212 while the other input of the multiplexor 212 is coupled to receive normal data values from the core logic (CORE_DATA).

The pattern generator 208 and state machine 220 may be designed to have another mode of operation in which a simple parallel to serial translation of the multi-bit value in the latch 310 is performed using the multiplexor 304. In such a mode, to generate a different sequence of test values, a different multi-bit test value needs to be loaded into the latch 310. This flexibility in operating modes allows a new test pattern to be loaded into the IC component, where the pattern was not part of the initial design of the BIST cell 106 and the state machine 220 (see FIG. 2).

The output of the multiplexor 212 feeds the driver 214 which is depicted as having another latch circuit 314 clocked also by the signal DATACLK. Note that additional analog circuitry, such as a single ended to differential amplifier if the output signal driven to pad 112 is of a differential type, is not shown but may be present in driver 214. In the embodiment shown in FIG. 3, test values are latched by the latch circuit 312 on the falling edge of DATACLK, and then transmitted on the rising edge of DATACLK. Other signaling protocols may alternatively be used, including for example a source synchronous topology as described below with reference to FIG. 4 in which a transmitted strobe signal accompanies the driven test value.

The embodiment of FIG. 3 also has some additional features such as controlling the multiplexor 212 using the two signals START and WRITE. Both of these would have to be asserted by the BIST control logic 124 (see FIG. 1) so that test data, rather than normal CORE_DATA is driven into the pad 112. Also, the serial/parallel latch 310 has SCAN_IN and SCAN_OUT capability in accordance with a test access protocol (TAP), synchronized according to a clock signal TAPCLK. The latch 310 also has a SHIFT input that controls the shifting of the stored value by one or more bits at a time. An ERROR value may be loaded into the latch 310, according to a CAPTURE signal being asserted. This feature allows an error indication from the comparison logic 222 (see FIG. 2) to be written to the latch 310, in addition to or as an alternative to storage in the input and output buffer error registers 224–234 (see FIG. 2). The error value in that case could be scanned out for each of the BIST cells 106, following completion of an AC I/O loopback test session. As an alternative, the error values could be stored in the registers 224–234 (FIG. 1) which may be read (by other system components or by an external tester) via a dedicated, low speed test bus (not shown). Other techniques suitable for extracting the captured error values from the IC component may alternatively be used.

Figure 4:
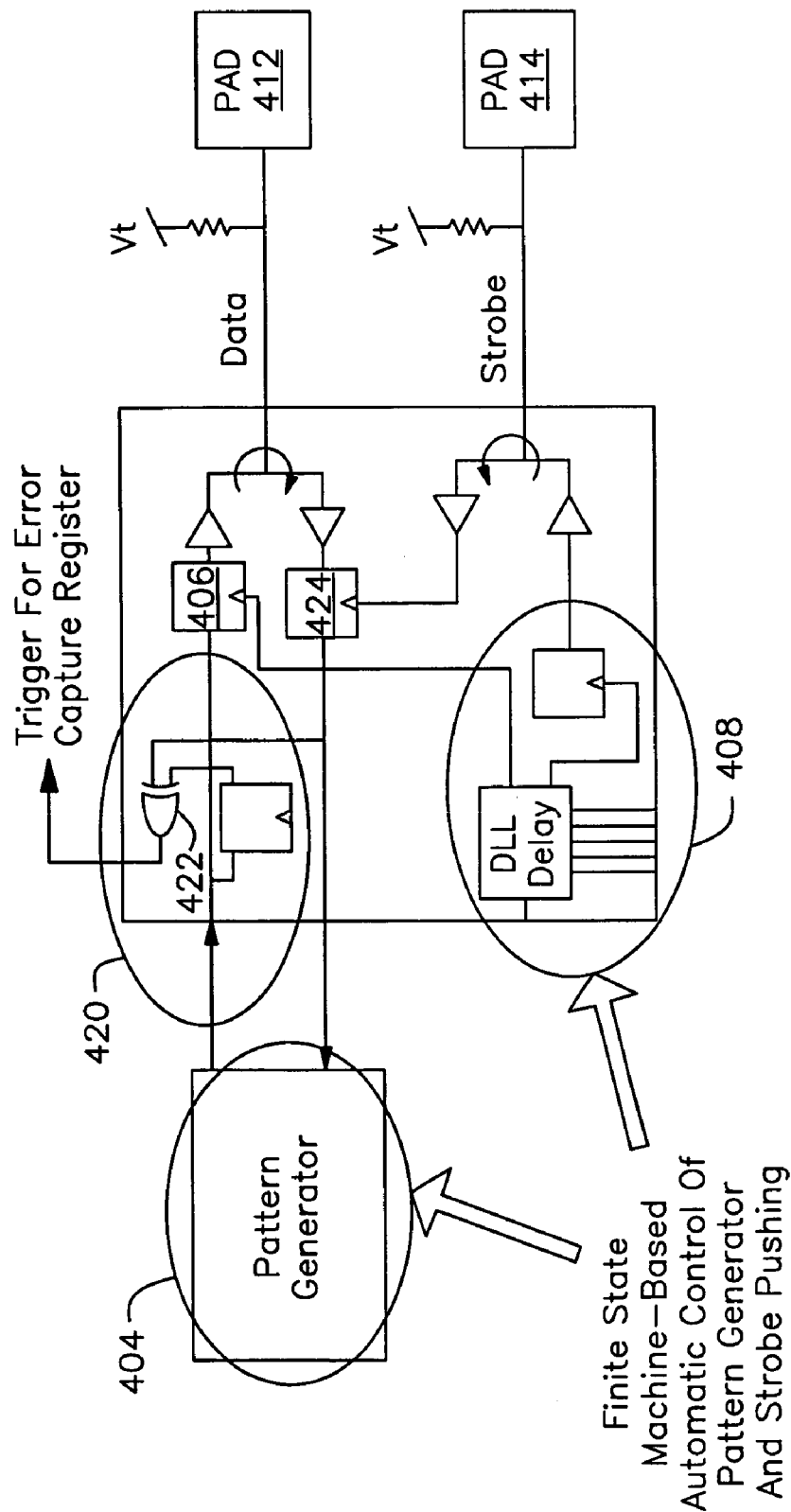
FIG. 4 illustrates a conceptual diagram of part of a BIST cell designed for AC I/O loopback testing of a source synchronous data signal.

Turning now to FIG. 4, part of a BIST cell that is designed for source synchronous operation is shown. The cell has a pattern generator 404 that generates a sequence of test values that are fed to a latch 406. The latch 406 is clocked by a transmit clock signal provided by, in this embodiment, a delay locked loop (DLL) circuit 408. The DLL circuit 408 also produces a strobe signal that has a predefined phase relationship to the transmit clock signal, so that the strobe signal may be used to recover the test value from a data signal. The data signal is driven into the pad 412 synchronized with the strobe signal driven into the pad 414. In practice, there may be multiple data signals associated with a single strobe signal.

To enable automatic, AC I/O loopback testing, finite state machine-based automatic control of both the pattern generator 404 and driver and/or receiver characteristics, in this case by strobe pushing in the DLL circuit 408, is provided, as part of the IC component. The "strobe pushing" refers to the shifting, that is advancing or delaying, of a strobe pulse versus a data pulse so as to determine the margin of operation of this particular I/O buffer circuit. A failure condition is detected by comparison logic 420, which compares one or more test values obtained from the pattern generator 404 to a looped back version of the test values using, in this embodiment, an EXCLUSIVE OR gate 422. Note how the looped back version of the test value is captured by a latch 424 clocked by a looped back strobe signal generated by the DLL circuit 408. The margin of operation may be determined by, as mentioned above, advancing or delaying this strobe signal via the DLL circuit 408 to continue to stress the driver until a failure occurs. Upon the occurrence of a failure condition, as indicated by the EXCLUSIVE OR gate 422, an error register (not shown) is used to capture the DLL setting for the strobe signal. Multiple failure settings may be captured, including the examples given above for "first fail" and "all fail". The error registers may then be read via a control register READ instruction sent to the IC component, or via scan chain commands sent to the IC component via a test access port. Allowing automatic control using the finite state machine, to change the patterns being driven and stress the driver and/or receiver, in this case by adjusting the strobe settings as described above, is expected to substantially reduce the total time needed to test the IC component, and in particular, its I/O buffers, thereby providing significant savings in the cost of testing advanced IC components that have a large number of pins.

Figure 5:
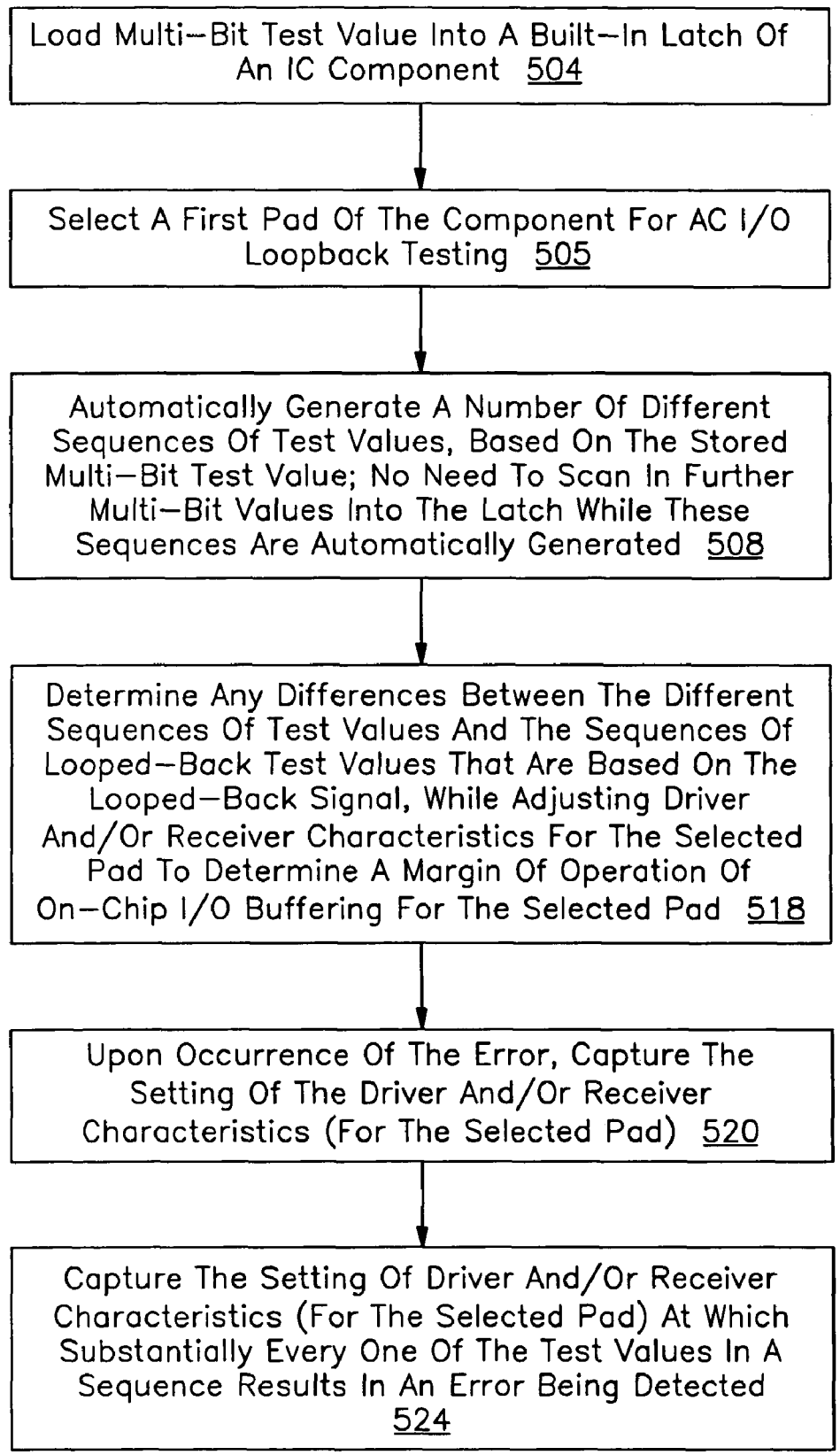
FIG. 5 is a flow diagram of a method for automatic AC I/O loopback testing.

Having described a specific hardware architecture for implementing the automatic AC I/O loopback testing, FIG. 5 shows a flow diagram of a more general method for such testing of an IC component. Operation begins with the loading of a multi-bit test value into a built in latch of the component (block 504). A first pad of the IC component is selected for AC I/O loopback testing (block 505). A number of different sequences of test values are automatically generated, based on the multi-bit test value stored in the latch. This is done without having to scan in further multi-bit values into the latch (block 508). A signal that is based on the different sequences of test values is driven into the selected pad, in a direction out of the IC component. The driven signal is looped back, for example, using a conductive signal trace that allows the selected pad to operate bi-directionally. A difference is determined, for this selected pad, between different sequences of test values and a number of sequences of looped-back test values (where these are based on the looped-back signal). The operations beginning with the automatic generation of the different sequences of test values, through the determination of the differences, are performed while automatically adjusting driver and/or receiver characteristics to stress the signaling for the selected pad. This is done to determine a margin of operation of on-chip I/O buffering for the selected pad (block 518).

During the AC I/O loopback test procedure described above, the setting of the driver and/or receiver characteristics at which the earliest error occurs is captured by the IC component (block 520). After this "first fail" condition, the test procedure continues to change the characteristics of the driver and/or receiver, while generating and looping back the test values, until a point is reached at which substantially everyone of the test values that is being driven results in an error; at this point, the driver and/or receiver characteristics setting that led to this "all fail" condition is captured (block 524).

The above described test procedure may be repeated on additional pads of the IC component. In an embodiment of the invention, the above test procedures can be performed simultaneously to verify operation of multiple I/O buffers of the IC component simultaneously. Note that in some embodiments, each BIST cell has a respective latch (as shown in the embodiments of FIGS. 2 and 3). Once the AC I/O loopback test session has completed, the captured error settings for all of the pads that have been tested can be read out of the IC component, as described above, using for example a scan chain readout procedure or a configuration register readout via either an in-band bus or a separate low-speed/test bus to which the IC component is connected in the system.

The AC I/O loopback testing described above may be performed prior to placing core logic of the IC component in operation. This is also known as the design validation stage, where the IC component's I/O buffers may be verified prior to completing the packaging of the IC component, and certainly prior to installing the packaged IC component on a carrier substrate and then into a platform. This latter embodiment is illustrated in FIG. 6.

Figure 6:
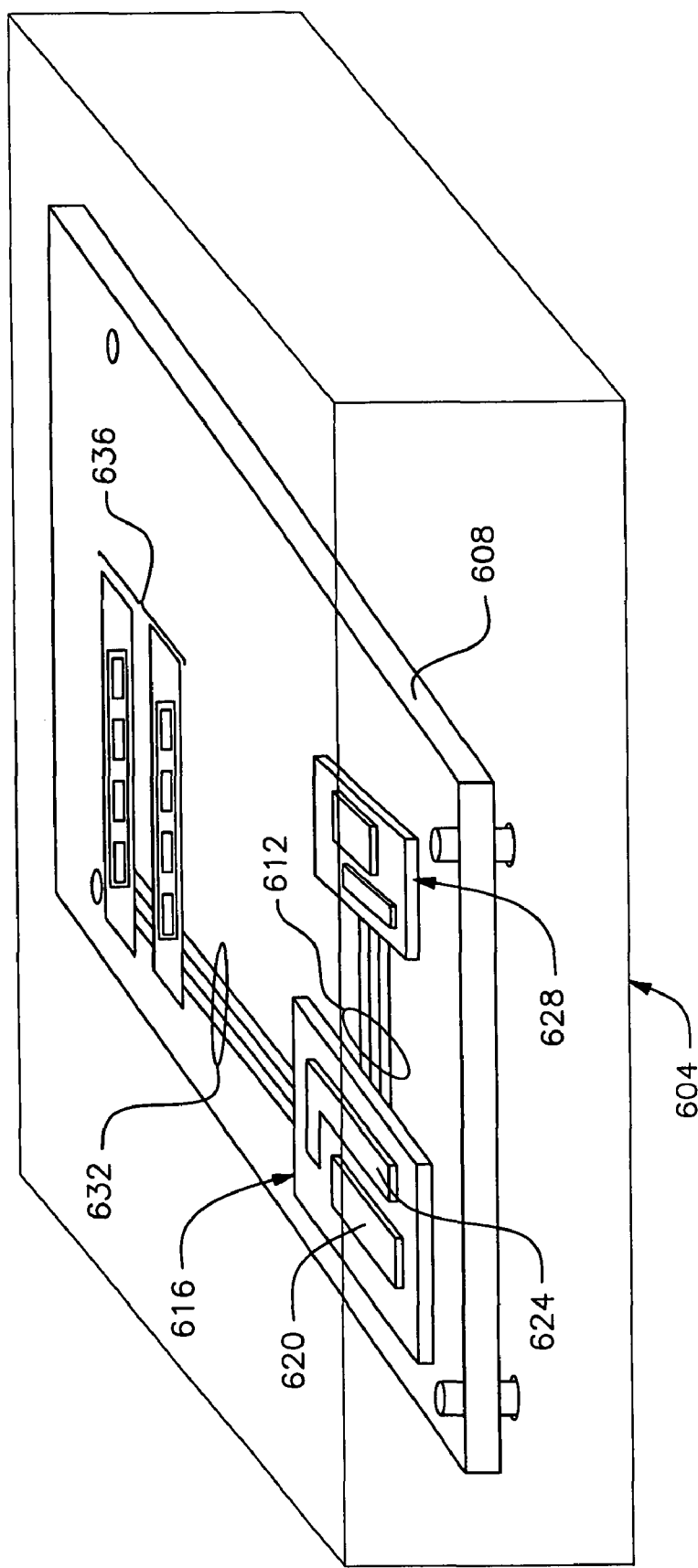
FIG. 6 shows a conceptual diagram of an electronic system or platform in which the AC I/O loopback testing techniques can be implemented.

FIG. 6 depicts a conceptual diagram of an electronic system or platform that includes a chassis 604. The chassis 604 may be part of a desktop, general purpose personal computer or a server machine. In other embodiments, the chassis 604 is part of a mobile computing device, such as a portable notebook computer or a personal digital assistant. A carrier substrate 608 is installed on the chassis 604. The carrier substrate 608 may be, for example, a single, system or "motherboard" printed wiring board on which most of the IC components that perform the primary functions of the system are installed. A data communications link 612, such as a parallel or serial bus, is formed in the carrier substrate 608. A processor 616 is communicatively coupled to the communications link 612, via either a direct solder connection or a socket (not shown). The processor 616 has a processor core 620 and an interface 624 to the communications link 612. The interface 624 may be designed to have the components shown in FIGS. 1–4 described above that allow the processor 616 to self-test its I/O buffers that connect with the communications link 612, according to an AC I/O loopback test procedure.

The system shown in FIG. 6 also has a system interface component 628 (sometimes referred to as a chipset) that is communicatively coupled to the communications link 612. The system interface component 628 allows the processor 616 to more efficiently communicate with other devices of the system (not shown), including devices such as graphics subsystem, a mass storage subsystem, and a peripheral device interface used for data network layer communications and dedicated audio and video channels for the system.

FIG. 6 also shows the presence of main memory 636 as multiple modules that are installed on the carrier substrate 608 and that are communicatively coupled to another data communications link 632. Thus, separate links 612 and 632 are provided in this embodiment, for the processor to communicate with the system interface 628 and the main memory 636. In other embodiments, the data communications link 612 may be a parallel, multi-drop system bus which is shared by not just the system interface 628 but also the main memory 636. Note that other computer architectures, not shown, may also benefit from the AC I/O loopback testing capability described here. In addition, the hardware architecture shown in FIGS. 1–4 may be implemented in advanced IC components other than processors, e.g. the system interface (chipset) component.

To summarize, various embodiments of an automatic, AC I/O loopback self-test technique for IC components have been described. In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method for testing an integrated circuit (IC) component, comprising:
    a) loading a multi-bit test value into a latch of the component;
    b) selecting a first pad of the component;
    c) automatically generating a plurality of different sequences of test values based on the multi-bit test value stored in the latch, without scanning-in further multi-bit values into the latch; and
    d) driving a signal that is based on the plurality of different sequences of test values into the selected pad and out of the component;
    e) looping back the driven signal; and
    f) determining for the selected pad a difference between the plurality of different sequences of test values and a plurality of sequences of looped-back test values that are based on the looped back signal, wherein c)–f) are performed while automatically adjusting one of driver and receiver characteristics to determine a margin of operation of on-chip I/O buffering for the selected pad.

2. The method of claim 1 further comprising:
    g) capturing the setting of one of said driver and receiver characteristics, for the selected pad, at which the earliest error occurs; and
    h) capturing the setting of one of said driver and receiver characteristics, for the selected pad, at which substantially every one of the test values in one of the plurality of different sequences results in an error.

3. The method of claim 2 further comprising:
selecting a second pad to test; and
performing c)–h) for the second pad.

4. The method of claim 3 wherein c)–h) for the first pad are performed simultaneously with c)–h) for the second pad.

5. The method of claim 3 wherein the plurality of different sequences of test values are generated based on reading for each selected pad a multi-bit test value from a respective latch.

6. The method of claim 2 further comprising:
performing c)–h) for every one of over one hundred pads of the IC component, and wherein the multi-bit test value is at least eight bits long.

7. The method of claim 6 further comprising:
reading out of the IC component the captured error settings for said plurality of pads.

8. The method of claim 7 wherein a)–f) are performed prior to placing core logic of the IC component in operation.

9. The method of claim 7 wherein a)–f) are performed during high volume manufacturing of a computer system platform of which said IC component is a primary part.

10. The method of claim 1 wherein the adjustment includes one of advancing and delaying a transmit clock associated with the said pad.

11. The method of claim 1 wherein the adjustment includes adjusting a threshold voltage level in a receiver associated with said pad.

12. An integrated circuit component comprising:
core logic;
a plurality of signal pads;
a plurality of test cells each coupled between a respective one of the plurality of signal pads and the core logic, each cell having
    a multi-bit latch with scan-chain input and output capability,
    a pattern generator having an input coupled to receive a multi-bit value from the latch and to generate a sequence of test values based on the value,
    a first multiplexor having an input coupled to the core logic and another input coupled to an output of the pattern generator,
    a driver having an input coupled to the output of the first multiplexer and an output coupled to the respective pad,
    a receiver having an input coupled to the respective pad, and
    comparison logic having an input coupled to the output of the pattern
generator and another input coupled to an output of the receiver; and a state machine coupled to control the pattern generator so that a plurality of different sequences of test values are generated and applied to the driver while the electrical characteristics of one of the driver and receiver are stressed until the comparison logic indicates an error.

13. The component of claim 12 wherein there are more than one hundred of the plurality of pads, and the multi-bit value of the latch is at least eight bits long.

14. The component of claim 13 wherein the pattern generator includes a second multiplexer whose input is coupled to receive the multi-bit value and whose output is coupled to an input of the first multiplexer, and wherein the state machine is coupled to control the second multiplexer via a plurality of control inputs of the second multiplexer.

15. The component of claim 14 wherein the pattern generator includes a first latch circuit coupled between the output of the second multiplexer and the input of the first multiplexer.

16. The component of claim 15 wherein the driver includes a second latch circuit whose input is coupled to the output of the first mutliplexer, and wherein the first and second latches are docked by the same dock signal.

17. The component of claim 16 wherein the state machine is to one of delay and advance a transition of the clock signal until the comparison logic indicates an error.

18. The component of claim 12 further comprising:
a first output buffer error register to store a first fail value that indicates the setting, for the driver, at which the earliest error is indicated by the comparison logic while the plurality of different sequences of test values are applied.

19. The component of claim 18 further comprising:
a second output buffer error register to store a second fail value that indicates the setting, for said driver, at which errors are indicated by the comparison logic for substantially all of the test values in one of the plurality of different sequences of test values being applied.

20. A system comprising:
a chassis;
a carrier substrate installed on the chassis;
a data communications link formed in the carrier substrate; and
a processor communicatively coupled to the data communications link, the processor having a processor core and an interface to the communications link, the interface includes a plurality of signal pads, a plurality of test cells each coupled between a respective one of the plurality of signal pads and the processor core,
each cell having a multi-bit latch with scan-chain input and output capability, a pattern generator having an input coupled to receive a multi-bit value from the latch and to generate a sequence of test values based on the value, a first multiplexor having an input coupled to the core logic and another input coupled to an output of the pattern generator, a driver having an input coupled to the output of the first multiplexer and an output coupled to the respective pad, a receiver having an input coupled to the respective pad, comparison logic having an input coupled to the output of the pattern generator and another input coupled to an output of the receiver, the interface further having a state machine coupled to control the pattern generator so that a plurality of different sequences of test values are generated and applied to the driver while the electrical characteristics of one of the driver and receiver are adjusted until the comparison logic indicates an error.

21. The system of claim 20 wherein the data communications link is a serial, point to point bus.

22. The system of claim 21 further comprising an integrated circuit (IC) system interface component communicatively coupled to the data communications link.

23. The system of claim 21 further comprising another data communications link formed in the carrier substrate and to which a main memory and the processor are communicatively coupled.

24. The system of claim 20 wherein the data communications link is a parallel, multi-drop bus.

25. The system of claim 24 further comprising an integrated circuit (IC) system interface component communicatively coupled to the parallel bus.

26. An integrated circuit (IC) component comprising:
means for performing a primary function of a computer system;
means for conducting component input and output (I/O) signals of the IC component;
means for storing a multi-bit test value;
means for automatically generating a plurality of different sequences of test values based on the same stored multi-bit test value, without having to repeatedly scan-in a different multi-bit value into the storage means;
means for forwarding one of a sequence of values from said primary function performance means and said sequences of test values;
means for translating said forwarded sequence into an output signal that is driven into the I/O signals conducting means;
means for translating an input signal from the I/O signals conducting means into a received sequence of values;
means for detecting that there is some difference between test values generated by the automatic test sequence generation means and a version of said test values that has been looped back through said input signal translation means; and
means for instructing one of a) said forwarded sequence translation means and b) said input signal translation means, to adjust its electrical characteristics until said difference determination means indicates an error, while said plurality of different sequences of test values are applied to said forwarded sequence translation means.

27. The IC component of claim 26 further comprising:
means for timing the plurality of different sequences of test values according to a transmit dock signal prior to arriving at said forwarding means.

28. The IC component of claim 27 further comprising:
means for storing the setting of the forwarded sequence translation means at which the earliest loopback error occurs.

29. The IC component of claim 28 further comprising:
means for storing the setting of the forwarded sequence translation means at which substantially every one of the test values of a sequence that is being looped back results in an error.

30. A method for testing an integrated circuit (IC) component, comprising:
a) loading a test value into a latch of the component;
b) selecting a first pad of the component;

c) automatically generating a plurality of different sequences of test values based on the test value stored in the latch, without scanning-in further values into the latch; and d) driving a signal that is based on the plurality of different sequences of test values into the selected pad;

e) looping back the driven signal; and f) determining for the selected pad whether or not a plurality of sequences of looped-back test values that are based on the looped back signal contain an error, wherein c)–f) are performed while automatically adjusting one of driver and receiver characteristics to determine a margin of operation of on-chip I/O buffering for the selected pad.

31. The method of claim 30 further comprising:

g) capturing the setting of one of said driver and receiver characteristics, for the selected pad, at which the earliest error occurs; and h) capturing the setting of one of said driver and receiver characteristics, for the selected pad, at which substantially every one of the test values in one of the plurality of different sequences results in an error.

32. The method of claim 31 further comprising:
selecting a second pad to test; and
performing c)–h) for the second pad.

33. The method of claim 32 wherein c)–h) for the first pad are performed simultaneously with c)–h) for the second pad.

34. The method of claim 32 wherein the plurality of different sequences of test values are generated based on reading for each selected pad a test value from a respective latch.

35. The method of claim 31 further comprising:
performing c)–h) for every one of over one hundred pads of the IC component, and wherein the test value is at least eight bits long.

36. The method of claim 35 further comprising:
reading out of the IC component the captured error settings for said plurality of pads.

37. The method of claim 36 wherein a)–f) are performed prior to placing core logic of the IC component in operation.

38. The method of claim 36 wherein a)–f) are performed during high volume manufacturing of a computer system platform of which said IC component is a primary part.

39. The method of claim 30 wherein the adjustment includes one of advancing and delaying a transmit clock a,associated with the selected pad.

40. The method of claim 30 wherein the adjustment includes adjusting a threshold voltage level in a receiver associated with the selected pad.

* * * * *

UNITED STATES PATENT AND TRADEMARK OFFICE
CERTIFICATE OF CORRECTION

| | | |
|---|---|---|
| PATENT NO. | : 7,139,957 B2 | Page 1 of 1 |
| APPLICATION NO. | : 10/611099 | |
| DATED | : November 21, 2006 | |
| INVENTOR(S) | : Querbach et al. | |

It is certified that error appears in the above-identified patent and that said Letters Patent is hereby corrected as shown below:

Column 9, at line 22, delete "docked", insert --clocked--.

Column 9, at line 22, delete "dock", insert --clock--.

Column 10, at line 47, delete "dock", insert --clock--.

Column 12, at line 19, delete "a," before "associated".

Signed and Sealed this

Fourth Day of September, 2007

JON W. DUDAS
*Director of the United States Patent and Trademark Office*